United States Patent
Fulford, Jr. et al.

[19]

[11] Patent Number: 5,918,126
[45] Date of Patent: *Jun. 29, 1999

[54] METHOD OF FABRICATING AN INTEGRATED CIRCUIT HAVING DEVICES ARRANGED WITH DIFFERENT DEVICE DENSITIES USING A BIAS DIFFERENTIAL TO FORM DEVICES WITH A UNIFORM SIZE

[75] Inventors: H. Jim Fulford, Jr.; Robert Dawson, both of Austin; Mark I. Gardner, Cedar Creek; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/805,796

[22] Filed: Feb. 25, 1997

[51] Int. Cl.$^6$ ............................................. H01L 21/8234
[52] U.S. Cl. ......................................................... 438/275
[58] Field of Search ............................ 438/275, 14, 107, 438/585, 104

[56] References Cited

U.S. PATENT DOCUMENTS

| | | | |
|---|---|---|---|
| 4,722,914 | 2/1988 | Drye et al. | 438/107 |
| 5,532,188 | 7/1996 | Wright | 438/631 |
| 5,552,996 | 9/1996 | Hoffman et al. | 364/468.28 |
| 5,598,010 | 1/1997 | Uematsu | 257/48 |
| 5,618,757 | 4/1997 | Bothra et al. | 438/699 |
| 5,665,199 | 9/1997 | Sahota et al. | 438/14 |
| 5,665,203 | 9/1997 | Lee et al. | 438/585 |
| 5,698,461 | 12/1997 | Liu | 438/585 |
| 5,702,564 | 12/1997 | Shen | 216/67 |
| 5,723,234 | 3/1998 | Yokoyama et al. | 430/5 |
| 5,736,442 | 4/1998 | Mori | 438/257 |

OTHER PUBLICATIONS

Silicon Processing for the VLSI Era—vol. 1: Process Technlogy, by S. Wolf, published by Lattice Press, Sunset Beach, CA, 1986, pp. 182–327.

Silicon Processing for the VLSI Era—vol. 2: Process Integration, by S. Wolf, published by Lattice Press, Sunset Beach, CA, 1990, pp.124–131.

S. Wolf and R.N. Tauber "Silicon Processing for the VLSI ERA vol. 1—Process Technology" Lattice Press, Sunset Beach, CA USA. pp. 521–529 and 547–568, No Month 1986.

*Primary Examiner*—Charles Bowers
*Assistant Examiner*—Craig Thompson
*Attorney, Agent, or Firm*—Skjerven, Morrill, MacPherson, Franklin & Friel LLP; Ken J. Koestner

[57] ABSTRACT

It has been discovered that different pattern densities that occur in conventional lithography produce a different final etch polysilicon gate width in high density (dense) regions of polysilicon gates as compared to low density (isolated) polysilicon gate regions. The final etch polysilicon gate width for a dense region is smaller by a predictable distance relative to the final etch polysilicon gate width for an isolated region. For example, a typical dense region has a final etch polysilicon gate width that is approximately 0.05 $\mu$m smaller relative to the final etch polysilicon gate width of isolated regions having a channel length of 0.35 $\mu$m. A biasing technique is employed for a polysilicon masking reticle in which the reticle is biased differently in regions of isolated polysilicon gates in comparison to regions of dense polysilicon gates. More specifically, in one embodiment the polysilicon masking reticle is increased in size in regions of high density polysilicon gates in comparison to regions of isolated polysilicon gates. In another embodiment, the reticle in regions of isolated polysilicon gates is sized normally but increased in size in regions of high density polysilicon gates. Following photomasking and etching, substantially identical polysilicon lengths are achieved in the isolated and dense gate regions.

20 Claims, 2 Drawing Sheets

METHOD OF FABRICATING AN INTEGRATED CIRCUIT HAVING DEVICES ARRANGED WITH DIFFERENT DEVICE DENSITIES USING A BIAS DIFFERENTIAL TO FORM DEVICES WITH A UNIFORM SIZE

BACKGROUND OF THE INVENTION

1. Field of the Invention

The present invention generally relates to a method of manufacturing integrated circuit devices on semiconductor substrates. More specifically, the present invention relates to a processing method for fabricating devices having a substantially equal etched polysilicon gate width in regions of an integrated circuit having different device densities.

2. Description of the Related Art

Polysilicon gate lengths are highly important for transistor scaling in a semiconductor device. Short-channel effects significantly alter the dc drive current—drain source voltage ($I_D$-$V_{DS}$) characteristics of long-channel MOSFETs that are operated in inversion. In one aspect, the combined effects of a reduced gate length (a reduced channel length) result in a change in threshold voltage $V_T$. In addition, the mobility of carriers in the channel are reduced by a "mobility-degradation factor" resulting from the gate field and a "velocity-saturation factor" due to the lateral channel field. The mobility-degradation factor and the velocity-saturation factor combine to reduce the drain current $I_D$. Furthermore, the channel length is modulated by the drain voltage when the device is in saturation, causing an increase in the drain current saturation voltage $I_{DSAT}$ with an increasing drain source voltage $V_{DS}$. The ultimate result of these variations affect drain current $I_D$ or source-to-drain current $I_{SD}$ that are caused by short-channel effects is a reduced integrated circuit speed performance and increased sensitivity to variations in gate length and other device parameters.

The performance of an integrated circuit depends not only on the value of the channel lengths but also upon the uniformity of the channel lengths across an integrated circuit. In an integrated circuit having some devices with relatively longer channel lengths and other devices with relatively shorter channel lengths, the devices with a shorter channel length have a higher effective drain current $I_D$ than devices with longer channel lengths. These differences in effective drain current $I_D$ in a integrated circuit create problems associated with hot carrier injection (HCI).

Hot carrier injection results as device dimensions are reduced while the supply voltage remains the same or the supply voltage is reduced but reduced more slowly than the device dimensions so that the lateral electric field in the device channel increases. The increase in lateral electric field causes inversion layer charges to be accelerated to be accelerated to cause various harmful device phenomena, called hot-carrier effects. A highly important hot-carrier effect is damage inflicted to the gate oxide or the silicon (Si)-oxide($SiO_2$) interface.

To avoid these harmful hot-carrier effects, the drive current must be limited. By limiting the drive current to devices with a shorter channel length to a suitable level to avoid hot-carrier effect problems, the drive current is also limited to devices with a longer channel length, thereby reducing the speed of the devices. The speed of an integrated circuit is optimized while reducing damage relating to hot-carrier effects by fabricating devices which have a substantially equal channel length.

What is needed is a technique for fabricating an integrated circuit that forms devices having a substantially uniform device channel length.

SUMMARY OF THE INVENTION

In accordance with the present invention, it has been discovered that different pattern densities that occur in conventional lithography produce a different final etch polysilicon gate width in high density (dense) regions of polysilicon gates as compared to low density (isolated) polysilicon gate regions. The final etch polysilicon gate width for a dense region is smaller by a predictable distance relative to the final etch polysilicon gate width for an isolated region. For example, a typical dense region has a final etch polysilicon gate width that is reduced by approximately 0.05 $\mu$m relative to the final etch polysilicon gate width of isolated regions having a channel length of 0.35 $\mu$m.

Therefore, in accordance with one embodiment of the present invention, a biasing technique is employed for a polysilicon masking reticle in which the reticle is biased differently in regions of isolated polysilicon gates in comparison to regions of dense polysilicon gates. More specifically, in one embodiment the polysilicon masking reticle is increased in size in regions of high density polysilicon gates in comparison to regions of isolated polysilicon gates. In another embodiment the reticle in regions of isolated polysilicon gates is sized normally but the reticle size is increased in regions of high density polysilicon gates. Following photomasking and etching, substantially identical polysilicon lengths are achieved in the isolated and dense gate regions.

Many advantages are achieved by the described fabrication method. Making all devices with the same gate length allows these devices to be better optimized to improve speed. In addition, reducing variations in devices reduces constraints on the resulting circuit design. The drain current of semiconductor devices is advantageously controlled using the described method. It is advantageous that the described method improves the performance of semiconductor devices without requiring additional semiconductor processing steps.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE PREFERRED EMBODIMENTS

Figure 1A:
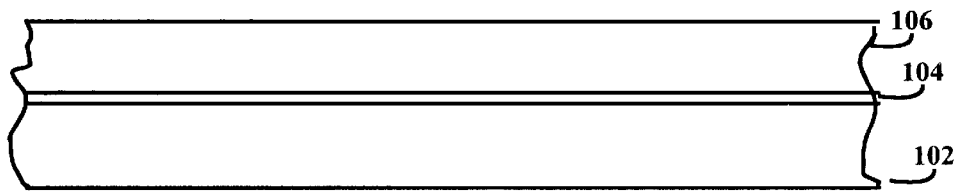
FIG. 1A through 1D depict a sequence of cross-sectional views showing steps of a method of processing a semiconductor wafer for forming devices having a substantially uniform device channel length and forming interconnect lines having a substantially uniform linewidth in accordance with an embodiment of the present invention.

Referring to FIG. 1A, a cross-sectional view of a semiconductor wafer 100 is shown including a silicon substrate wafer 102, a thin gate oxide layer 104 formed by gate oxidation overlying the silicon substrate wafer 102, and polysilicon gate layer 106 deposited on the thin gate oxide layer 104. The thin gate oxide layer 104 and the polysilicon gate layer 106 are formed on the surface of the substrate wafer 102 in preparation for subsequent device fabrication steps that form individual polysilicon gate structures on the substrate wafer 102.

In many integrated circuits, individual devices in various sections of a semiconductor wafer 100 are arranged in different configurations and densities. For example, some wafers include devices having a wide range of functionality with the variability in functionality being reflected in a variability in layout configuration. One implication arising from the variability in configuration is that some sections of the substrate wafer 102 are densely populated with devices and other sections include only relatively isolated devices.

Figure 1B:
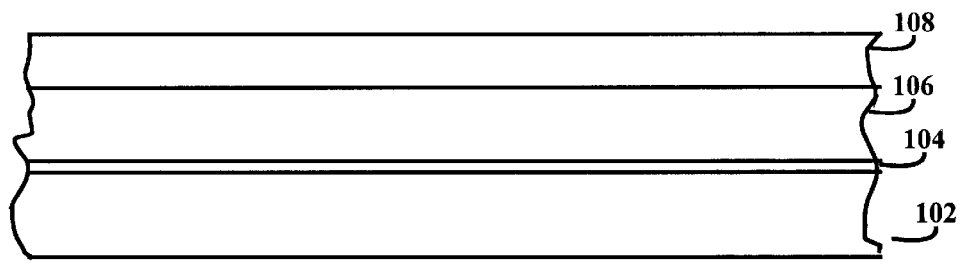
Figure 1C:
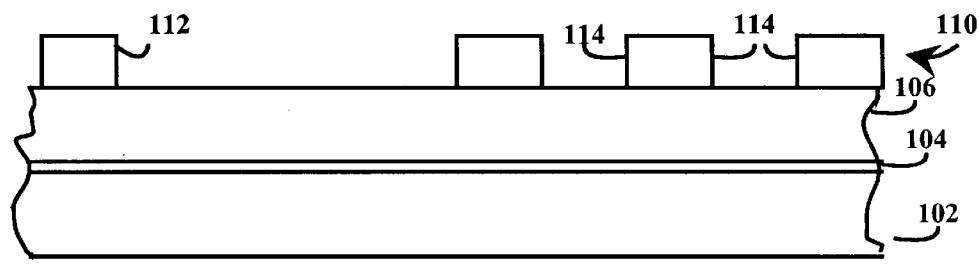

Referring to FIG. 1B, a photoresist mask 108 is deposited overlying the polysilicon gate layer 106 using a suitable deposition technique such as spin-coating. The photoresist mask 108 is then patterned to define polysilicon structures including individual gate electrodes corresponding to the individual devices, and etched to mutually separate the individual gate electrodes. Referring to FIG. 1C, a patterned photoresist mask layer 110 includes a photoresist mask layer element 112 for patterning an isolated device and three photoresist mask layer elements 114 for patterning a plurality of devices in a region including a plurality of densely-populated devices. One configuration of densely-populated devices includes a first polysilicon gate structure, a second polysilicon gate structure formed a minimum distance from the first polysilicon gate structure, and a contact formed between the first and second polysilicon gate structures. The minimum distance between the polysilicon gate structures is determined by resolution limitations of the photolithographic imaging system used to pattern the substrate wafer 102. More specifically, the density of spacing between devices is expressed as a minimum pitch, which is defined as the sum of the minimum dimensions of the polysilicon that can be printed and the space between adjacent lines.

The photoresist mask layer element 112 for the isolated device is separated from other polysilicon structures by at least several microns. In contrast, the photoresist mask layer elements 114 for patterning the densely-populated devices are mutually separated by distances of less than a micron. Polysilicon gate structures are formed by etching the portions of the polysilicon gate layer 106 that are not protected by the photoresist mask layer 110. The process of etching of the polysilicon gate layer 106 typically involves a plasma etching procedure in which a plasma generates reactive gas species that chemically etch the material in direct proximity to the plasma, or by ions generated by a plasma some distance from the wafer and accelerated toward the wafer.

The critical dimension of the isolated polysilicon structures that are etched using a patterned photoresist mask layer 110 is different from the critical dimension of densely-populated devices. The differences in critical dimension may result from poorly-understood differences in chemistry of the plasma etch process, such as an acceleration in the rate of reactive ion etching in regions having a dense formation of photoresist mask layer elements 114. The differences in critical dimension may also be caused by variability in photolithographic accuracy between densely-populated structures and isolated structures. Irrespective of the cause of differences in critical dimension of isolated and densely-populated structures, it has been found that an etching process for forming both densely-populated structures and isolated structures produces densely-populated structures having a smaller critical dimension. For example, it has been found that a process for forming 0.3 $\mu$m length polysilicon gate structures produces isolated polysilicon gate structures having a gate length suitably close to 0.3 $\mu$m but produces densely-populated polysilicon gate structures having a length of approximately 0.25 $\mu$m. It has been found that relative differences in critical dimension are accentuated as dimensions are reduced.

The differences in critical dimension for isolated and dense structures are compensated in imaging patterns such as a reticle chrome plate. The reticle formed for patterning photoresist mask layer elements 112 for isolated devices are made different in size in comparison to photoresist mask layer elements 114 for patterning the densely-populated devices. In the illustrative embodiment, the photoresist mask layer element 112 for the isolated device is formed to correspond approximately equally to the intended size of the device. In contrast the photoresist mask layer elements 114 for patterning the densely-populated devices are formed to a size larger than the intended size of the devices. In the illustrative embodiment, the photoresist mask layer element 112 for the isolated device having a length of 0.3 $\mu$m is formed to fabricate a 0.3 $\mu$m device while the photoresist mask layer elements 114 for patterning the densely-populated devices having lengths of 0.35 $\mu$m are formed to fabricate 0.3 $\mu$m devices.

Figure 1D:
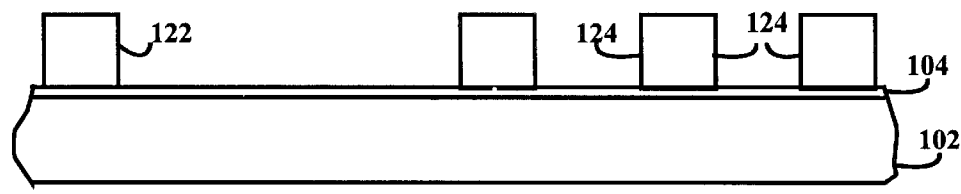

Referring to FIG. 1D, photomask printing of the photoresist mask layer 110 and etching of the polysilicon gate layer 106 creates a semiconductor wafer 100 having isolated polysilicon structures 122 and densely-populated polysilicon structures 124 with substantially the same length. In the illustrative embodiment, the isolated polysilicon structures 122 and the densely-populated polysilicon structures 124 have lengths of approximately 0.3 $\mu$m.

Typically, the photoresist mask 108 is patterned using projection photolithography in which an optical system produces an image of the photoresist mask 108 on the silicon substrate wafer 102. The photoresist mask 108 and the silicon substrate wafer 102 are moved in synchronism to scan the entire silicon substrate wafer 102. The scan is commonly performed using optical stepping. An optical mask, called a reticle, contains a pattern for a portion of the silicon substrate wafer 102. For some integrated circuits, multiple reticles are used to pattern the entire silicon substrate wafer 102. For some integrated circuits, the same reticle is used repetitively to produce multiple identical circuits on multiple sections of the silicon substrate wafer 102. The pattern is imaged onto the silicon substrate wafer 102, the silicon substrate wafer 102 is moved, and the exposure is repeated. The pattern on the reticle may be highly magnified in comparison to the pattern formed on the silicon substrate wafer 102. For example, five times magnification is common for accurately writing a pattern to a wafer.

To compensate for differences in critical dimension for isolated and dense structures, a reticle is constructed to increase the length of photoresist mask layer elements 114 for patterning the densely-populated devices with respect to the photoresist mask layer elements 112 for isolated devices. The increase in length of the photoresist mask layer elements 114 resulting in improved uniformity in polysilicon channel length for fabricated integrated circuits devices, advantageously improving integrated circuit speed performance. Present-day photolithography systems commonly implement a reticle technology having a resolution of 20 nm–30 nm.

Figure 2:
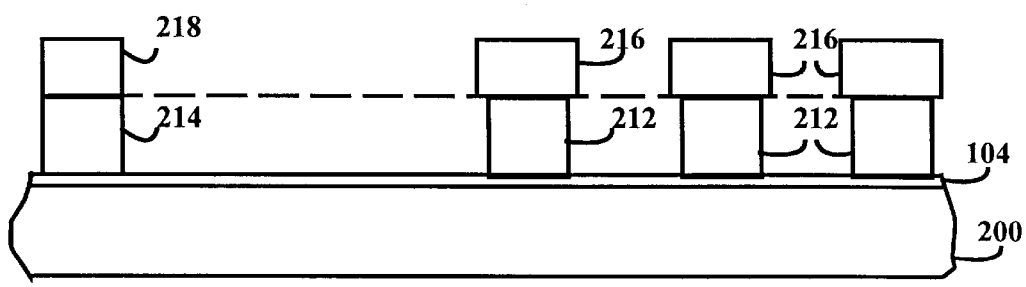
FIG. 2 is a schematic, pictorial cross-sectional view of a semiconductor wafer illustrating a technique for setting the dimensions of a reticle to adjust the spacing between device structures so that isolated devices and devices in densely-populated regions have substantially equal critical dimensions.

Referring to FIG. 2, a schematic, pictorial cross-sectional view of a semiconductor wafer 200 depicts a technique for setting the dimensions of a reticle to adjust the spacing between device structures so that isolated devices and devices in densely-populated regions have substantially equal critical dimensions. The reticle for patterning a photoresist mask layer 210 is constructed so that the center lines designating the center of a device structure length are separated by a defined distance. An intended device length is defined and a distance of half the length is determined. The reticle is patterned so that the half-length is extended by an amount that compensates for the difference between critical dimensions of devices in a densely-populated region in comparison to isolated devices. The photoresist mask layer 210 is deposited and patterned in accordance with the compensating reticle so that the polysilicon gate layer 106 is etched to form polysilicon gate structures that have gate lengths that are substantially identical in isolated and densely-populated regions. For example, a plurality of gate structures 212 in a densely-populated region are intended to have a gate length of 0.3 μm and a separation between gate structures 212 of 0.3 μm and an isolated gate structure 214 also has a 0.3 μm gate length but is positioned 3.0 μm from the nearest element of the gate structures 212. The center-to-center spacing of the densely-populated gate structures 212 is the gate length plus the separation for a total spacing of 0.6 μm. To fabricate gate structures 212 having the intended dimensions, a photoresist mask layer 210 is deposited, printed and developed to form gate masking structures including masking structures 216 in the densely-populated region and an isolated masking structure 218. The masking structures 216 are positioned so that the center lines of the masking structures 216 are separated by 0.6 μm. The masking structures 216 in the densely-populated region are patterned to have a length of 0.35 μm and are centered on the defined center lines to form 0.3 μm length gate structures 212 at a 0.3 μm edge-to-edge spacing. The isolated masking structure 218 is patterned to have a length of 0.3 μm.

Figure 3:
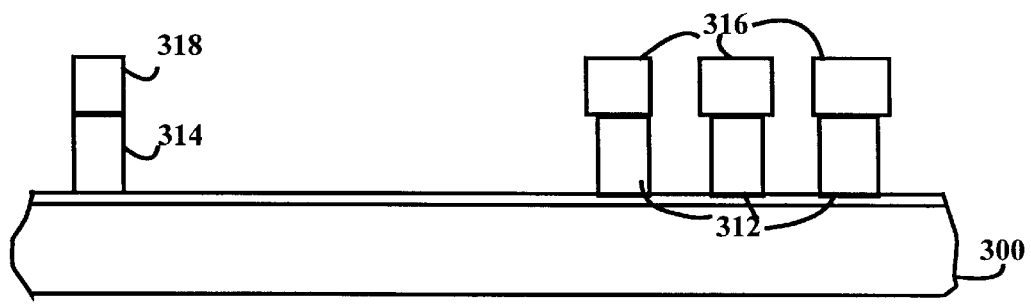
FIG. 3 is a schematic, pictorial cross-sectional view of a semiconductor wafer illustrating an alternative embodiment of a technique for setting the dimensions of a reticle to adjust the spacing between device structures so that isolated devices and devices in densely-populated regions have substantially equal critical dimensions.

In other embodiments, devices are fabricated with different dimensions. In an example that is depicted in FIG. 3, devices with a gate length approximately equal to 0.2 μm are fabricated so long as such an optical beam size is possible. To achieve a gate length of about 0.2 μm using an optical system having a resolution of 20 nm, isolated photoresist mask elements 310 are formed having a length of 0.18 μm so that isolated polysilicon gate elements 312 with a length of 0.18 μm are constructed. Densely-populated devices 320 are constructed using dense photoresist mask elements 322 that are 0.2 μm in length, resulting in fabrication of dense polysilicon gate elements 324 which have a length typically ranging from 0.18 μm to 0.19 μm. Resolution of the optical system determines the accuracy at which dimensions for dense devices are made equal to dimensions of isolated devices.

While the invention has been described with reference to various embodiments, it will be understood that these embodiments are illustrative and that the scope of the invention is not limited to them. Many variations, modifications, additions and improvements of the embodiments described are possible. The invention is defined by the appended claims in light of their full scope of equivalents.

What is claimed is:

1. A method of forming a plurality of polysilicon structures on a semiconductor substrate, the plurality of polysilicon structures including isolated structures and densely-populated structures, the method comprising:

defining a configuration of polysilicon structures including isolated structures and densely-populated structures by measuring a distance between center lines designating the center of a device structure length;

defining an etch bias differential spacing compensating for an etch bias of densely-populated structures with respect to isolated structures; and formulating a mask image based on the defined configuration of polysilicon structures and including the etch bias differential compensation, the formulated mask image compensating the distance between center for differences in critical dimensions of isolated structures and densely-populated structures.

2. A method according to claim 1 further comprising:

determining a half-length value that designates the half-length between the center lines across the semiconductor substrate; and patterning the reticle so that the half-length is extended by an amount that compensates for the difference between critical dimensions of devices in a densely-populated region in comparison to isolated devices.

3. A method according to claim 1 wherein the step of defining an etch bias differential spacing includes:

increasing the length dimension of densely-populated structures with respect to isolated structures.

4. A method according to claim 1 wherein the step of defining an etch bias differential spacing includes:

increasing the photoresist structure dimension for defining a densely-populated polysilicon structure having an intended dimension length of 0.3 μm to an approximate dimension length of 0.35 μm.

5. A method according to claim 1 wherein the step of defining an etch bias differential spacing includes:

increasing the photoresist structure dimension for defining a densely-populated polysilicon structure having an intended dimension length of 0.18 μm to an approximate dimension length of 0.2 μm.

6. A method of forming a plurality of devices on a semiconductor substrate, the plurality of devices including isolated devices and densely-populated devices, the method comprising:

defining a configuration of devices including isolated devices and densely-populated devices by measuring a distance between center lines designating the center of a device structure length;

defining an etch bias differential spacing compensating for an etch bias of densely-populated devices with respect to isolated devices; and formulating a mask image based on the defined configuration of devices and including the etch bias differential compensation, the formulated mask image compensating the distance between center for differences in critical dimensions of isolated structures and densely-populated structures.

7. A method according to claim 6 further comprising:

determining a half-length value that designates the half-length between the center lines across the semiconductor substrate; and patterning the reticle so that the half-length is extended by an amount that compensates for the difference between critical dimensions of devices in a densely-populated region in comparison to isolated devices.

8. A method according to claim 6 wherein the step of defining an etch bias differential spacing includes:

increasing the device length of densely-populated devices with respect to isolated devices.

9. A method according to claim 6 wherein the step of defining an etch bias differential spacing includes:

increasing the device length dimension for defining a densely-populated device having an intended dimension length of 0.3 μm to an approximate dimension length of 0.35 μm.

10. A method according to claim 6 wherein the step of defining an etch bias differential spacing includes:

increasing the device length dimension for defining a densely-populated device having an intended dimension length of 0.18 μm to an approximate dimension length of 0.2 μm.

11. A method of forming a plurality of devices on a semiconductor substrate, the plurality of devices including isolated devices and densely-populated devices, the method comprising:

defining a configuration of polysilicon structures including isolated devices and densely-populated devices by measuring a distance between center lines designating the center of a device structure length;

structuring a polysilicon masking reticle in compliance with the defined configuration of polysilicon structures;

biasing the polysilicon masking reticle based upon the density of polysilicon structures in the defined configuration, the formulated mask image compensating the distance between center for differences in critical dimensions of isolated structures and densely-populated structures.

12. A method according to claim 11 wherein biasing the polysilicon masking reticle further comprises increasing the polysilicon masking reticle in size in regions of high density polysilicon gates in comparison to regions of isolated polysilicon gates.

13. A method according to claim 11 wherein biasing the polysilicon masking reticle further comprises the increasing the polysilicon masking reticle in size in regions of high density polysilicon gates and sizing the polysilicon masking reticle to an intended gate size in regions of isolated polysilicon gates.

14. A method according to claim 11 further comprising:

determining a half-length value that designates the half-length between the center lines across the semiconductor substrate; and patterning the reticle so that the half-length is extended by an amount that compensates for the difference between critical dimensions of devices in a densely-populated region in comparison to isolated devices.

15. A method according to claim 11 wherein the step of defining an etch bias differential spacing includes:

increasing the structure length of densely-populated polysilicon structures with respect to isolated devices.

16. A method according to claim 11 wherein the step of defining an etch bias differential spacing includes:

increasing the structure length dimension for defining a densely-populated polysilicon structure having an intended dimension length of 0.30 μm to an approximate dimension length of 0.35 μm.

17. A method according to claim 11 wherein the step of defining an etch bias differential spacing includes:

increasing the structure length dimension for defining a densely-populated structure having an intended dimension length of 0.18 μm to an approximate dimension length of 0.29 μm.

18. A method according to claim 1, further comprising:

fabricating an integrated circuit including devices formed from the polysilicon structures including isolated devices and densely-populated devices having equal channel lengths.

19. A method according to claim 6, further comprising:

fabricating an integrated circuit including the devices including isolated devices and densely-populated devices having equal channel lengths.

20. A method according to claim 11, further comprising:

fabricating an integrated circuit including the polysilicon structures including isolated devices and densely-populated devices having equal channel lengths.

* * * * *